(12) United States Patent
Wolters et al.

(10) Patent No.: US 7,605,915 B2
(45) Date of Patent: Oct. 20, 2009

(54) SYSTEM AND METHOD TO CREATE HAZE STANDARD

(75) Inventors: Christian Wolters, Campbell, CA (US); Aleksey Petrenko, Milpitas, CA (US); Jurgen Reich, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 249 days.

(21) Appl. No.: 11/697,296

(22) Filed: Apr. 5, 2007

(65) Prior Publication Data

US 2008/0245958 A1  Oct. 9, 2008

(51) Int. Cl.
*G01B 11/30* (2006.01)
(52) U.S. Cl. .................. 356/243.7; 356/237.2
(58) Field of Classification Search .... 356/234.4–234.8
See application file for complete search history.

(56) References Cited

U.S. PATENT DOCUMENTS

| | | | | |
|---|---|---|---|---|
| 5,198,869 A | * | 3/1993 | Monteverde et al. | 356/243.4 |
| 5,599,464 A | * | 2/1997 | Laird et al. | 216/2 |
| 5,691,812 A | * | 11/1997 | Bates et al. | 356/243.4 |
| 6,836,362 B2 | * | 12/2004 | Potyrailo et al. | 359/445 |
| 2006/0250593 A1 | * | 11/2006 | Nishii | 355/53 |

OTHER PUBLICATIONS

Scheer, Bradley. "Development of a physical haze and microroughness standard" SPIE vol. 2862, Nov. 1996, pp. 78-95.*

* cited by examiner

*Primary Examiner*—Gregory J Toatley, Jr.
*Assistant Examiner*—Rebecca C Slomski
(74) *Attorney, Agent, or Firm*—Luedeka, Neely & Graham, P.C.

(57) ABSTRACT

In one embodiment, a system to create a haze standard on a surface of an object, comprises a radiation targeting assembly that targets a radiation beam onto the surface of the object, a drive assembly to impart relative motion between the radiation targeting assembly and the surface of the object, and a controller to regulate the radiation targeting assembly to deliver radiation at a controlled power level to at least one portion of the surface, thereby forming at least one region having a known haze characteristic.

14 Claims, 3 Drawing Sheets

SYSTEM AND METHOD TO CREATE HAZE STANDARD

BACKGROUND

The subject matter described herein relates to surface inspection techniques, and more particularly to a system and method to create a haze standard.

Surface metrology equipment and techniques may be used to characterize discrete surface features (e.g., particles, pits, etc) and surface roughness characteristics (e.g., texture, haze). In this context, the term "haze" refers to a degree of scattering of an optical signal reflected from a surface of an object. Some surface inspection equipment requires periodic calibration for haze measurement. Calibration may be performed using objects, typically disks or wafers, which have surface imperfections that produce a known (i.e., standard) haze measurement. Hence, the term "haze standard" may refer to the standardized haze measurement, or to the object (i.e., the disk or wafer) that includes one or more haze standards on its surface.

Haze standards have been created using chemical etching processes, lithographic processes, and epitaxial growth processes. These processes suffers from deficiencies including, for example, process stability, cost, reproducibility, and production limitations including limitations on the number of haze standards that may be incorporated into a single wafer. Additional techniques for producing haze standards would therefore find utility.

BRIEF DESCRIPTION OF THE DRAWINGS

The detailed description is described with reference to the accompanying figures.

DETAILED DESCRIPTION

Described herein are exemplary systems and methods for creating a haze standard. In the following description, numerous specific details are set forth in order to provide a thorough understanding of various embodiments. However, it will be understood by those skilled in the art that the various embodiments may be practiced without the specific details. In other instances, well-known methods, procedures, components, and circuits have not been described in detail so as not to obscure the particular embodiments.

Various methods described herein may be embodied as logic instructions on a computer-readable medium. When executed on a processor the logic instructions cause a processor to be programmed as a special-purpose machine that implements the described methods. The processor, when configured by the logic instructions to execute the methods described herein, constitutes structure for performing the described methods.

Figure 1:
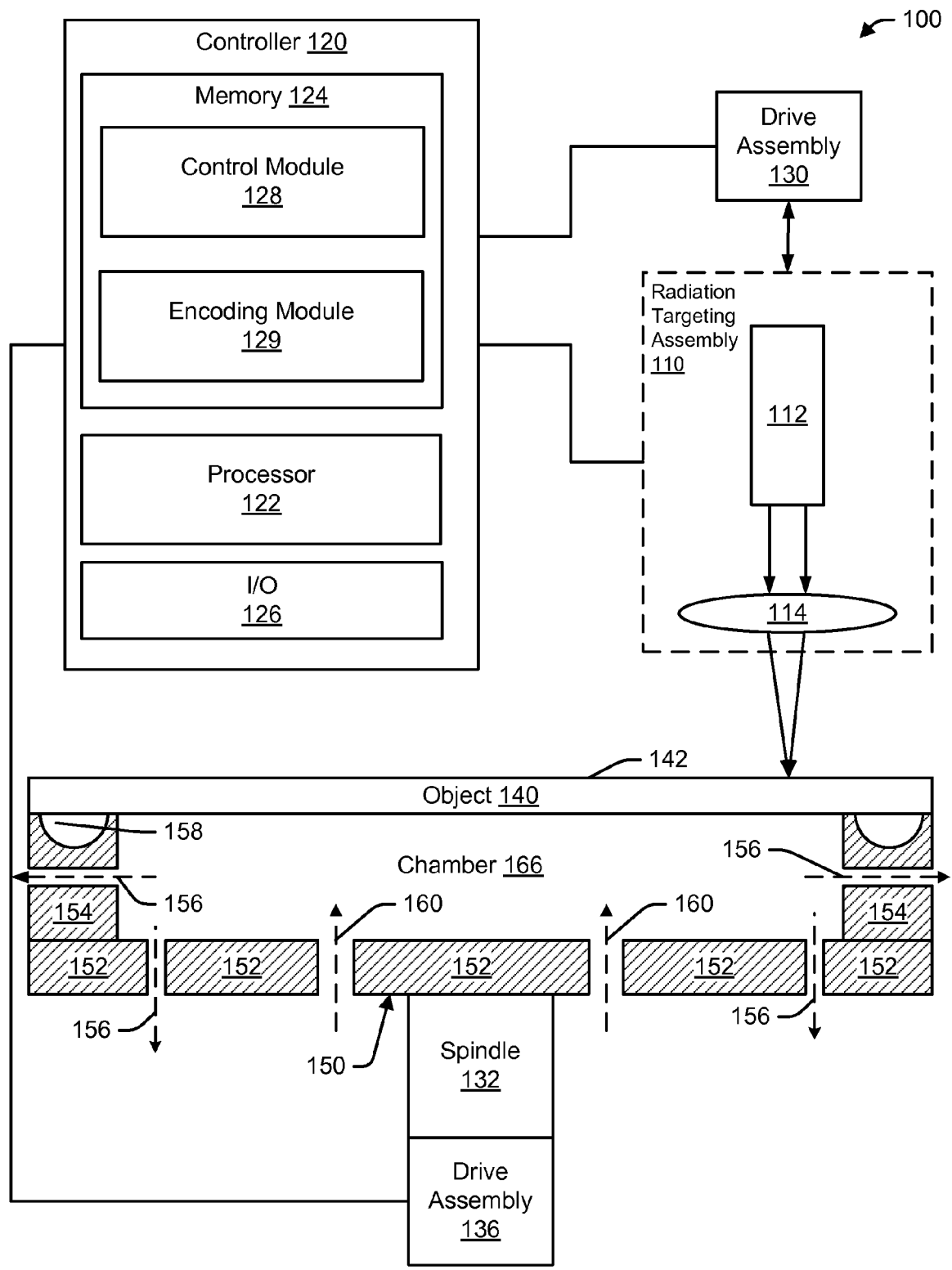
FIG. 1 is a schematic illustration of various components of one embodiment of a system to create a haze standard.

FIG. 1 is a schematic illustration of various components of one embodiment of a system to create a haze standard. Referring to FIG. 1, system 100 comprises a radiation targeting assembly 110, a controller 120, and a drive assembly 130.

In the embodiment depicted in FIG. 1, radiation targeting assembly 110 comprises a radiation source such as, e.g., a laser source 112. Laser source 112 may be embodied as, e.g., a multi-mode, multi-wavelength laser source 112 which is available from Rohm Co., LTD Kyoto, Japan as model number RLD-78MV. In another embodiment the laser source is available from Coherent, Inc as model number LabLaser 635 nm. Laser source 112 may generate a laser beam (or pulse) having a wavelength that measures between 150 nanometers (nm) and 2000 nm at a power level sufficient to result in the desired haze change. For example, the laser source may generate radiation at a power level that measures approximately 1 watt for a spot size of 10×20 $mm^2$ that and a wavelength of 266 nm, pulsed at 80 MHz 12 pus.

Radiation targeting assembly 110 further includes at least one focusing lens 114 to focus radiation from the laser source 112 onto the surface 142 of object 140. In some embodiments, lens 114 focuses the radiation from laser 112 into a spot size that measures between 1 square micrometer and 10 square millimeters.

In some embodiments radiation targeting assembly 110 may include additional optical components to condition the radiation from laser source 112. For example, radiation targeting assembly 110 may include one or more polarizers, collimating lenses, filters, or other optical components.

In the embodiment depicted in FIG. 1, controller 120 comprises a processor 122, a memory module 124, and an input/output module. Controller 120 may be embodied as a special-purpose control unit such as, e.g., a programmable logic unit (PLU) or as a general-purpose computing device such as, e.g., a personal computer.

The processor 122 may be embodied as one or more processors in the Pentium® family of processors including the Pentium® II processor family, Pentium® III processors, Pentium® IV processors available from Intel® Corporation of Santa Clara, Calif. Alternatively, other CPUs may be used, such as Intel's Itanium®, XEON™, and Celeron® processors. Also, one or more processors from other manufactures may be utilized. Moreover, the processors may have a single or multi core design.

The memory 124 stores data and sequences of instructions that are executed by the processor 122, or any other device included in the controller 120. In some embodiments, the memory 124 includes random access memory (RAM); however, memory 124 may be implemented using other memory types such as dynamic RAM (DRAM), synchronous DRAM (SDRAM), and the like. In the embodiment depicted in FIG. 1, memory 124 comprises a control module 128 and an encoding module 129, which are described in greater detail below.

I/O module may provides an interface to input/output (I/O) devices coupled to the computer system 100. The ICH 126 may be coupled to a peripheral component interconnect (PCI) bus or other bus structure to communicate between devices of controller 120. Other types of I/O interconnect topologies may be utilized such as the PCI Express™ architecture, available through Intel® Corporation of Santa Clara, Calif.

Drive assembly 130 may include a motor or other device to impart relative motion between the radiation targeting assembly 110 and the surface 142 of the object 140. In some embodiments, drive assembly 130 moves the radiation targeting assembly 110 in a radial direction across the surface of object 140.

In some embodiments, the object 140 may be embodied as a semiconductor wafer, a glass or ceramic substrate which may be incorporated into, e.g., a hard disk drive, or the like. Object 140 may be mounted on a chuck 150 which is coupled to a spindle 132, which is in turn coupled to a drive assembly 136. In operation, drive assembly 136 imparts rotary motion to spindle 132, which in turn causes the chuck 150 and object 140 to rotate about a central axis.

Chuck 150 comprises a body 152 and a support member 154 that extends above a portion of a surface of the body. In some embodiments, body 152 may be a substantially flat disk, and support member 154 may be an annular ring mounted on the upper surface of body 152 that comprises a vacuum groove 158 in the upper surface of support member 154. In one embodiment the width of the vacuum groove measures approximately 0.9 mm and the vacuum groove defines two ridges (i.e., an inner ridge and an outer ridge) that provide sufficient contact area with the wafer 140 to prevent the from shearing off the chuck when the chuck and wafer are rotating at high rates of speed. In alternate embodiments the shape and radius can differ and, in some embodiments, the vacuum groove can be discontinuous. In operation, the air pressure in the vacuum groove is reduced to facilitate holding object 140 on the chuck 150 while the chuck 150 is rotating.

When the object 140 is placed onto the support member 154, the object 140, the support member 154, and the body 152 of the chuck 150 form a chamber 166. In some embodiments, venturi holes 156 may be formed on the support member 154 (or the body 152) of the chuck 150. These holes 156 act as small venturis that permit air to flow out of the chamber 166, which reduces the air pressure in the chamber 166. Depending upon the speed of rotation of spindle 132, the air pressure in the chamber 166 may become substantially lower than the air pressure in the region above the object 140, which causes the wafer to bow downward. Such bowing may cause the object to lose its seal with the vacuum groove 158 which may result in the object 140 detaching itself from the chuck 150.

In order to compensate for this 'negative' deflection, chuck body 152 may include one or more inlet holes 160 that, in one embodiment, are positioned closer to the center of the chuck body, relative to the venturi holes 156. The high linear velocity at the outer edge of the chuck enables the outer holes 156 to act as venturi holes, essentially sucking air out of the chamber. The inlet holes permit air to flow back into the chamber, which reduces the effect of the venturi holes 156. The number of inlet holes 108 and venturi holes 106 can vary depending upon a variety of factors including the type of wafer, the thickness of the wafer and the anticipated rotation rate. In one embodiment, numerous inlet holes 108 and venturi holes 106 are available to be used and the user can cover or block those that are not necessary for the particular wafer 140 that will be tested.

Figure 2:
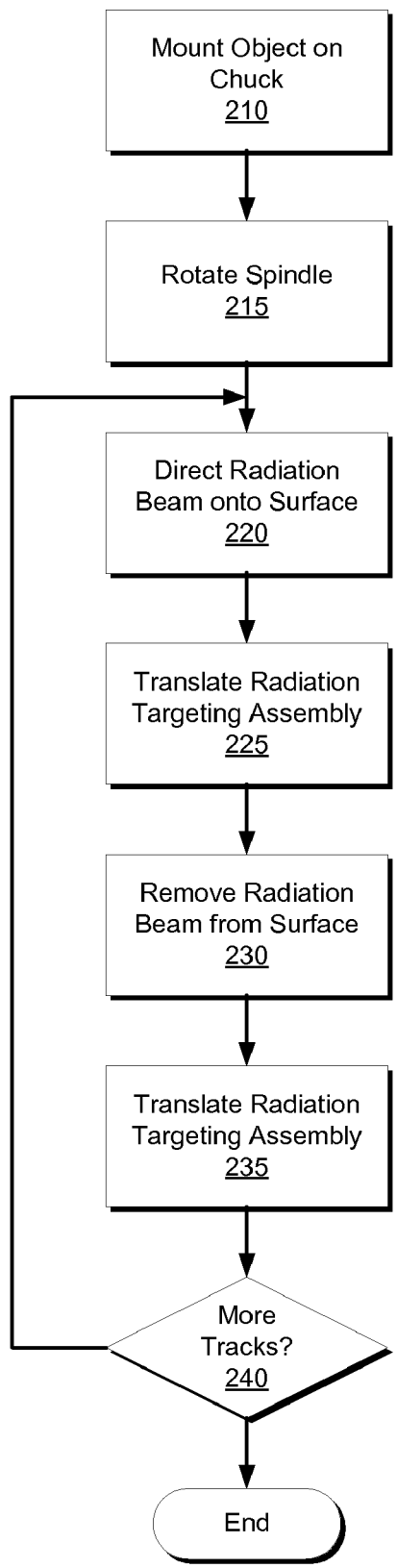
FIG. 2 is a flowchart illustrating operations in one embodiment of a method to create a haze standard.

In some embodiment, the control module 128 includes logic instructions which, when executed by processor 122, configure the controller 120 to control the operations of system 100 by controlling the drive assemblies 130, 136 and the radiation targeting assembly 130. FIG. 2 is a flowchart illustrating operations in a method to create a haze standard which may be used in the system of FIG. 1. Some of the operations of FIG. 2 may be implemented by one or more elements of system 100 under the control of processor 122.

Referring to FIG. 2, at operation 210 an object is mounted on the chuck 150. For example, a wafer or other object may be placed on the chuck by a human operator or by a picker or other object controlled by controller 120. At operation 215 the spindle is rotated. For example, controller 120 may activate drive assembly 136 to rotate spindle 132. At operation 220 a radiation beam is directed onto the surface of 142 of object 140.

For example, controller 120 may activate laser source 112 to generate a radiation beam, which is focused onto the surface 140. In some embodiments the laser source generates laser radiation having a wavelength that measures between 150 nanometers and 2000 nanometers, at a power level sufficient to result in the desired haze change, e.g., 1 W for 10×20 um^2 spot at 266 nm 80 MHz pulsed.

At operation 225 the radiation targeting assembly is translated across the surface 142 of object 140. For example, controller 120 may activate drive assembly 130 to move the radiation targeting assembly 110 across the surface 142 of object 140 in a substantially radial direction. At operation 230 the radiation is removed from the surface 142. For example, the controller 120 may deactivate laser source 112. At operation 235 the radiation targeting assembly is translated across the surface 142 of object 140. For example, controller 120 may activate drive assembly 130 to move the radiation targeting assembly 110 across the surface 142 of object 140 in a substantially radial direction. In some embodiments the controller regulates the drive assemblies 130, 136 such that the surface 142 illuminated by the laser spot moves at a constant linear velocity that measures between 10 meters/second and 23 meters/second.

Thus, operations 220-235 direct radiation of a predetermined wavelength, power level, and spot size onto the surface 142 of object 140 while object 140 is rotated on spindle 132. These operations create a track of defective surface 142 on object 140. If, at operation 240, there are more tracks to be processed, then control passes back to operation 220.

Figure 3:
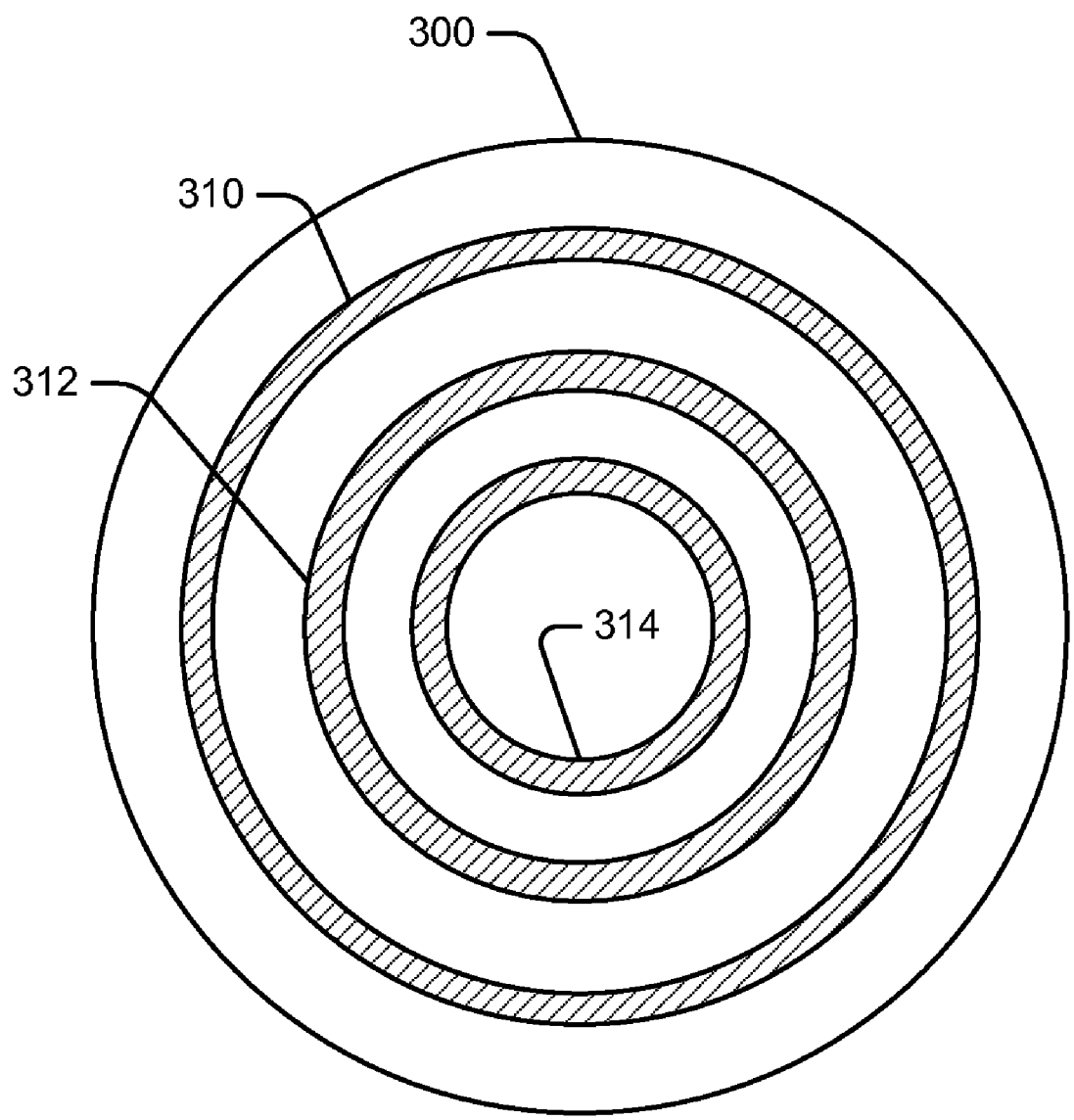
FIG. 3 is a schematic illustration of one embodiment of a haze standard disk.

FIG. 3 is a schematic illustration of one embodiment of a haze standard disk 300. In the embodiment depicted in FIG. 3, operations 220-235 are repeated three times to create a haze standard disk having three distinct haze standard tracks, identified by reference numerals 310, 312, 314. In operation, operating parameters such as, e.g., laser power, spot size and rotation speed may be varied such that the various tracks 310, 312, 314 have varying haze standards.

Although the embodiment depicted here utilizes rotary motion about a central axis to create haze standard regions, it will be appreciated that regions may be formed using linear motion in two dimensions (e.g., on an x-y axis) to create haze standard regions.

Reference in the specification to "one embodiment" or "an embodiment" means that a particular feature, structure, or characteristic described in connection with the embodiment is included in at least an implementation. The appearances of the phrase "in one embodiment" in various places in the specification may or may not be all referring to the same embodiment.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A system for creating a haze standard on a surface of an object, comprising:
   a radiation targeting assembly for targeting a radiation beam onto the surface;
   a drive assembly for imparting relative motion between the radiation beam and the surface; and
   a controller for regulating the radiation beam at a plurality of controlled power levels to a plurality of concentric rings on the surface, thereby forming a plurality of regions having known haze characteristics.

2. The system of claim 1, wherein the drive assembly comprises:
   a first drive assembly for imparting linear motion between the radiation beam and the surface; and a second drive assembly for imparting rotary motion between the radiation beam and the surface.

3. The system of claim 2, wherein the second drive assembly further comprises:
a spindle coupled to a motor for inducing rotary motion; and
a chuck coupled to the spindle and comprising:
a body;
a support member extending above at least a portion of the surface of the body, such that the object, the body, and the support member define a chamber;
wherein at least one of the body or the support member comprises at least one channel, such that rotation of the spindle generates a partial vacuum in the chamber.

4. The system of claim 1, wherein the radiation targeting assembly targets the radiation beam onto the surface at an angle approximately normal to the surface.

5. A system for creating a haze standard on a surface of an object, comprising:
a laser source for generating a radiation beam and for targeting the radiation beam onto the surface at a power level sufficient to create a desired haze change on the surface;
a first drive assembly for moving the radiation beam in a radial direction across the surface;
a second drive assembly for rotating the object such that the surface moves at a constant velocity, and
a controller for regulating the radiation beam at a controlled power level to at least one portion of the surface, thereby forming at least one region having a known haze characteristic.

6. A method for creating a haze standard on a surface of an object, the method comprising the steps of:
targeting a radiation beam onto the surface;
imparting relative motion between the radiation beam and the surface; and
delivering the radiation beam at a plurality of controlled power levels and to a plurality of concentric rings on the surface, thereby forming a plurality of regions having known haze characteristics.

7. The method of claim 6, wherein imparting relative motion between the radiation beam and the surface comprises:
imparting linear motion between the radiation beam and the surface; and
imparting rotary motion between the radiation beam and the surface.

8. The method of claim 7, wherein imparting rotary motion between the radiation beam and the surface further comprises:
coupling a spindle to a motor for inducing rotary motion; and
coupling a chuck coupled to the spindle, the chuck comprising:
a body;
a support member extending above at least a portion of the surface of the body, such that the object, the body, and the support member define a chamber;
wherein at least one of the body or the support member comprises at least one channel, such that rotation of the spindle generates a partial vacuum in the chamber.

9. The method of claim 6, wherein the radiation beam is targeted onto the surface at an angle approximately normal to the surface.

10. A method for creating a haze standard on a surface of an object, the method comprising the steps of:
targeting a radiation beam onto the surface;
imparting relative motion between the radiation beam and the surface;
powering the radiation beam at a power level sufficient to create a desired haze change on the surface;
moving the radiation beam radially across the surface; and
rotating the object such that the surface moves at a constant velocity,
thereby forming at least one region on the surface having a known haze characteristic.

11. A system for creating a haze standard on a surface of an object, comprising:
means for directing a radiation beam onto the surface;
means for imparting relative motion between the radiation beam and the surface; and
means for delivering the radiation beam at a plurality of controlled power levels to a plurality of concentric rings on the surface, thereby forming a plurality of regions having known haze characteristics.

12. The system of claim 11, wherein the means for imparting relative motion comprises:
a first drive assembly for imparting linear motion between the radiation beam and the surface; and
a second drive assembly for imparting rotary motion between the radiation beam and the surface.

13. The system of claim 12, wherein the second drive assembly further comprises:
a spindle coupled to a motor for inducing rotary motion; and
a chuck coupled to the spindle and comprising:
a body;
a support member extending above at least a portion of the surface of the body, such that the object, the body, and the support member define a chamber;
wherein at least one of the body or the support member comprises at least one channel, such that rotation of the spindle generates a partial vacuum in the chamber.

14. A system for creating a haze standard on a surface of an object, comprising:
a laser source for generating a radiation beam at a power level sufficient to create a desired haze change on the surface;
a first drive assembly for moving the radiation beam in a radial direction across the surface;
a second drive assembly for rotating the object such that the surface moves at a constant velocity, and
means for delivering radiation at a controlled power level to at least one portion of the surface, thereby forming at least one region having a known haze characteristic.

* * * * *